United States Patent
Michael et al.

(10) Patent No.: US 9,442,798 B2
(45) Date of Patent: Sep. 13, 2016

(54) NAND FLASH MEMORY HAVING AN ENHANCED BUFFER READ CAPABILITY AND METHOD OF OPERATION THEREOF

(71) Applicant: Winbond Electronics Corporation, Taichung (TW)

(72) Inventors: Oron Michael, San Jose, CA (US); Anil Gupta, Saratoga, CA (US)

(73) Assignee: Winbond Electronics Corporation, Taichung (TW)

(*) Notice: Subject to any disclaimer, the term of this patent is extended or adjusted under 35 U.S.C. 154(b) by 124 days.

(21) Appl. No.: 14/448,945

(22) Filed: Jul. 31, 2014

(65) Prior Publication Data

US 2016/0034352 A1    Feb. 4, 2016

(51) Int. Cl.
*G11C 29/00* (2006.01)
*G06F 11/10* (2006.01)
*G11C 16/10* (2006.01)
*G11C 16/26* (2006.01)
*G11C 29/04* (2006.01)

(52) U.S. Cl.
CPC ....... *G06F 11/1072* (2013.01); *G06F 11/1064* (2013.01); *G11C 16/10* (2013.01); *G11C 16/26* (2013.01); *G11C 2029/0411* (2013.01)

(58) Field of Classification Search
CPC ............. G06F 12/0246; G06F 3/0679; G06F 2212/7201; G06F 12/02
See application file for complete search history.

(56) References Cited

U.S. PATENT DOCUMENTS

| | | | |
|---|---|---|---|
| 5,822,245 A | 10/1998 | Gupta et al. | |
| 6,775,184 B1 | 8/2004 | Park et al. | |
| 7,120,836 B1 | 10/2006 | Englin et al. | |
| 7,171,536 B2 | 1/2007 | Chang et al. | |
| 7,558,900 B2 | 7/2009 | Jigour et al. | |
| 7,559,004 B1 * | 7/2009 | Chang | H03M 13/11 714/708 |
| 7,822,965 B2 * | 10/2010 | Li | G06F 11/1417 711/170 |
| 8,019,938 B2 * | 9/2011 | Flynn | G06F 1/183 711/113 |
| 8,051,358 B2 | 11/2011 | Radke | |
| 8,103,936 B2 | 1/2012 | Pekny et al. | |
| 8,437,197 B2 * | 5/2013 | Takagiwa | G11C 11/5642 365/185.02 |
| 8,533,572 B2 | 9/2013 | Lu et al. | |
| 8,667,368 B2 | 3/2014 | Gupta et al. | |
| 8,898,548 B1 * | 11/2014 | Mullendore | H03M 13/353 365/185.09 |

(Continued)

FOREIGN PATENT DOCUMENTS

| | | |
|---|---|---|
| CN | 1902599 A | 1/2007 |
| JP | 06-005085 | 1/1994 |

(Continued)

OTHER PUBLICATIONS

Hynix Inc. 1Gbit (128Mx8bit / 64 Mx16bit) NAND Flash Memory, Rev. 1.1, Nov. 2005. 48 Pages.

(Continued)

*Primary Examiner* — Esaw Abraham
(74) *Attorney, Agent, or Firm* — Finnegan, Henderson, Farabow, Garrett & Dunner LLP

(57) ABSTRACT

A page buffer suitable for continuous page read may be implemented with a partitioned data register, a partitioned cache register, and a suitable ECC circuit. The partitioned data register, partitioned cache register, and associated ECC circuit may also be used to realize a substantial improvement in the page read operation by using a modified Page Data Read instruction and/or a Buffer Read instruction, including in some implementations the use of a partition busy bit.

20 Claims, 9 Drawing Sheets

(56) References Cited

U.S. PATENT DOCUMENTS

| | | |
|---|---|---|
| 9,124,432 B2 | 9/2015 | Nagai et al. |
| 2003/0002366 A1 | 1/2003 | Mizoguchi et al. |
| 2004/0153902 A1 | 8/2004 | Machado et al. |
| 2005/0289314 A1 | 12/2005 | Adusumilli et al. |
| 2008/0239809 A1 | 10/2008 | Chae et al. |
| 2008/0313389 A1 | 12/2008 | Chow et al. |
| 2009/0019215 A1 | 1/2009 | Lee et al. |
| 2009/0150588 A1 | 6/2009 | Wang et al. |
| 2009/0271567 A1 | 10/2009 | Huang |
| 2010/0142275 A1 | 6/2010 | Yogev et al. |
| 2011/0041039 A1 | 2/2011 | Harari et al. |
| 2011/0238898 A1 | 9/2011 | Honda |
| 2012/0069657 A1 | 3/2012 | Choi et al. |
| 2012/0075931 A1 | 3/2012 | Yuh |
| 2012/0155173 A1 | 6/2012 | Lee et al. |
| 2013/0013817 A1 | 1/2013 | Chen et al. |
| 2013/0080858 A1* | 3/2013 | Lee .................... G11C 16/349 714/773 |
| 2013/0138879 A1 | 5/2013 | Kulkarni |
| 2013/0339634 A1 | 12/2013 | Zhang et al. |
| 2013/0346671 A1 | 12/2013 | Michael et al. |
| 2014/0269065 A1 | 9/2014 | Jigour et al. |

FOREIGN PATENT DOCUMENTS

| | | |
|---|---|---|
| JP | 08-045285 | 2/1996 |
| JP | 2001-184874 | 7/2001 |
| JP | 2001-202792 | 7/2001 |
| JP | 2003-085054 | 3/2003 |
| JP | 2003-249082 | 9/2003 |
| JP | 2010-146654 | 3/2010 |
| JP | 2011-221996 | 11/2011 |
| TW | I351604 | 11/2011 |
| WO | 2005066790 A1 | 7/2005 |

OTHER PUBLICATIONS

Hynix Inc. 4Gb (512Mxbit) NAND Flash HY27UF084G2M, Rev. 0.3, Nov. 2005. 54 Pages.

Micron Technology, Inc. 1Gb NAND Flash Memory, Revision E, 2006. 70 Pages.

Micron Technology, Inc. Get More for Less in Your Embedded Designs with Serial NAND Flash, Jul. 28, 2009. 2 Pages.

Micron Technology, Inc. Micron on Die ECC Webinar, Topic 4, Offerings—Serial (SPI) (Slides), 2009. 3 Pages.

Micron Technology, Inc. NAND Flash Memory, Serial Peripheral Interface (SPI) MT29F1G01ZAC, 2009. 2 Pages.

Winbond Electronics Corporation. W25N01GV 3V 1G-Bit Serial Spin and Flash Memory With Dual/Quad SPI, Preliminary Revision A, Feb. 11, 2013. 61 Pages.

Winbond Electronics Corporation. W25Q64CV spiflash 3V 64M-Bit Serial Flash Memory With Dual and Quad SPI, Revision F, May 7, 2012. 80 Pages.

Winbond Electronics Corporation. W25Q128FV spiflash 3V 128M-Bit Serial Flash Memory With Dual/Quad SPI and QPI, Revision D, Oct. 1, 2012. 97 Pages.

Winbond Electronics Corporation. W25N01GV spiflash 3V 1G-Bit Serial SLC Nand Flash Memory with Dual/Quad SPI & Continuous Read, Preliminary Revision B, Nov. 26, 2013. 69 Pages.

Cooke, J. On-die ECC NAND, Micron Technologies, Inc. slides 25-1 and 25-2, 2009, [online] [retrieved on Oct. 5, 2012]. Retrieved from the Internet:<URL:http://extmedia.micron.com/webmedia/ondieecc/ondieecc.html>.

Japanese Patent Office. Office Action: Japanese Patent Application No. 2013-055404, Feb. 12, 2014. 6 Pages.

Michael, Oron et al. Reply to Office Action: U.S. Appl. No. 13/530,518, Jun. 12, 2014. 31 Pages.

Michael, Oron et al. Reply to Office Action: U.S. Appl. No. 13/530,518, Nov. 11, 2014. 15 Pages.

Michael, Oron et al. Request for Continued Examination: U.S. Appl. No. 13/530,518, Feb. 2, 2015. 26 Pages.

Micron Technology, Inc. NAND Flash Memory, MT29F2G08AABWP, MT29F2G16AABWP, MT29F4G08BABWP, MT29F4G16BABWP, MT29F8G08FABWP, 2004. 57 Pages.

Micron Technology, Inc. Technical Note TN-29-01: NAND Flash Performance Increase Using the Micron Page Read Cache Mode Command, 2004. 10 Pages.

Micron Technology, Inc. Technical Note TN-29-17: Design and Use Considerations for NAND Flash Memory, 2006.8 Pages.

Micron Technology, Inc. Technical Note TN-29-19: NAND Flash 101: An Introduction to NAND Flash and How to Design It in to Your Next Product, 2006. 27 Pages.

Micron Technology, Inc. Technical Note TN-29-42: Wear-Leveling Techniques in NAND Flash Devices, 2008. 8 Pages.

Micron Technology, Inc. Technical Note TN-29-59: Bad Block Management in NAND Flash Memory, 2011. 4 Pages.

United States Patent and Trademark Office. Advisory Action: U.S. Appl. No. 13/530,518, Jan. 2, 2015. 3 Pages.

United States Patent and Trademark Office. Office Action: U.S. Appl. No. 13/530,518, Feb. 19, 2014. 35 Pages.

United States Patent and Trademark Office. Office Action: U.S. Appl. No. 13/530,518, Sep. 11, 2014. 36 Pages.

Winbond Electronics Corporation. W25Q64DW spiflash 1.8V 64M-Bit Serial Flash Memory with Dual/Quad SPI and QPI, Preliminary Revision C, Jan. 13, 2011. 82 Pages.

ELNEC. NAND Flash Memories and Programming NAND Flash Memories Using ELNEC Device Programmers: Application Note, Version 2.10, Aug. 2008. 44 Pages.

Gupta, Anil. New Architecture for Code-Shadowing Applications, Flash Memory Summit, Santa Clara, CA, Aug. 15, 2013. 14 Pages.

Michael, Oron. Reply to Office Action: U.S. Appl. No. 14/450,188, Mar. 3, 2016. 16 Pages.

Micron Technology, Inc. Technical Note TN-29-25: Improving NAND Flash Performance Using Two-Plane Command Enabled Micron Devices MT29F4G08AAA, MT29F8G08BAA. MT29F8G08DAA, MT29F16G08FAA, MT29F8G08MAA, MT29F16G08QAA, and MT29F32G08TAA, 2007. 11 Pages.

Nexflash Technologies, Inc. NX25F640C 64M-Bit Serial Flash Memory with 4-Pin SPI Interface, Nov. 2002. 24 Pages.

Cooke, J. The Inconvenient Truths of NAND Flash Memory, Flash Memory Summit, Santa Clara, CA, Micron Technologies, Inc. Aug. 2007. 32 Pages.

Cooke, J. On-die ECC NAND, Micron Technologies, Inc., slide 13, 2009, [online] [retrieved on Apr. 13, 2012]. Retrieved from the Internet:<URL:http://extmedia.micron.com/webmedia/ondiecc/ondiecc.html>.

\* cited by examiner

NAND FLASH MEMORY HAVING AN ENHANCED BUFFER READ CAPABILITY AND METHOD OF OPERATION THEREOF

BACKGROUND OF THE INVENTION

1. Field of the Invention

The present invention relates to digital memory devices and operation thereof, and more particularly to NAND flash memory having an enhanced buffer read capability and methods of operation thereof.

2. Description of Related Art

NAND flash memory is popular for data storage. The cost versus density advantage of single level cell ("SLC") NAND flash memory in densities of 512 Megabits and higher is largely due to the inherently smaller memory cell size used in SLC NAND flash technology.

NAND flash memory is also becoming popular for a variety of applications in addition to data storage, including code shadowing. Although commonly used SLC NAND flash memory has architectural, performance and bad block limitations that make it difficult to support the high speed code shadow applications for which serial NOR flash memory is well suited, various techniques have been developed to adapt NAND flash memory to such applications. Moreover, NAND flash memory has been developed with serial interface compatibility and a high degree of instruction compatibility with serial NOR flash memory. Unfortunately, some instructions execute quite slowly on a NAND flash memory architecture.

BRIEF SUMMARY OF THE INVENTION

One embodiment of the present invention is a method of operating a digital memory device to read data from a page of data stored therein to a data bus, comprising: receiving a page data read instruction specifying a page of the digital memory device; responsive to the page data read instruction receiving step, setting a first status bit and a second status bit to "busy;" responsive to the page data read instruction receiving step, loading data from the specified page of data into a page buffer in the digital memory device, the page buffer being partitioned into at least a first part and a second part; responsive to the page data read instruction receiving step, performing first ECC processing of the data in the first part of the page buffer to establish first ECC-processed data therein; resetting the first status bit to "not busy" upon completion of the first ECC processing performing step; responsive to the page data read instruction receiving step, performing second ECC processing of the data in a second part of the page buffer to establish second ECC-processed data therein; and resetting the second status bit to "not busy" upon completion of the second ECC processing performing step.

Another embodiment of the present invention is a method of operating a digital memory device to read data from a page of data stored therein, comprising: receiving a page data read instruction specifying a page of the digital memory device; responsive to the page data read instruction receiving step, setting a partition busy bit to "busy;" responsive to the page data read instruction receiving step, loading data from the specified page of data into a page buffer in the digital memory device, the page buffer being partitioned into at least a first part and a second part; responsive to the page data read instruction receiving step, performing first ECC processing of the data in the first part of the page buffer to establish first ECC-processed data therein; receiving a buffer read instruction; responsive to the buffer read instruction receiving step, outputting the first ECC-processed data from the first part of the page buffer to a data bus; performing, in an overlapping relationship with the first ECC-processed data outputting step, second ECC processing of the data in a second part of the page buffer to establish second ECC-processed data therein; and resetting the partition busy bit to "not busy" upon completion of the second ECC processing performing step.

Another embodiment of the present invention is a digital memory device comprising: a NAND flash memory array; a row decoder coupled to the NAND flash memory array; a data register coupled to the NAND flash memory array; a cache register coupled to the data register; an ECC circuit coupled to the cache register; a column decoder coupled to the cache register; a partition busy bit; and a control circuit coupled to the row decoder, the column decoder, the data register, the cache register, the ECC circuit, and the partition busy bit. The control circuit comprises logic and register elements for executing the functions of: receiving a page data read instruction specifying a page of the digital memory device; responsive to the page data read instruction receiving function, setting the partition busy bit to "busy;" responsive to the page data read instruction receiving function, loading data from the specified page of data into the data register, the data register being partitioned into at least a first part and a second part; replicating the page data from the data register to the cache register, the cache register being partitioned into at least a first part and a second part corresponding to the first part and the second part of the data register; responsive to the page data read instruction receiving function, performing first ECC processing of the data in the first part of the cache register to establish first ECC-processed data therein; receiving a buffer read instruction; responsive to the buffer read instruction receiving function, outputting the first ECC-processed data from the first part of the cache register to a data bus; performing, in an overlapping relationship with the first ECC-processed data outputting function, second ECC processing of the data in a second part of the cache register to establish second ECC-processed data therein; and resetting the partition busy bit to "not busy" upon completion of the second ECC processing performing function.

Another embodiment of the present invention is a digital memory device comprising: a NAND flash memory array; a row decoder coupled to the NAND flash memory array; a data register coupled to the NAND flash memory array; a cache register coupled to the data register; an ECC circuit coupled to the cache register; a column decoder coupled to the cache register; and a control circuit coupled to the row decoder, the column decoder, the data register, the cache register, and the ECC circuit. The control circuit comprises logic and register elements for executing the functions of: receiving a page data read instruction specifying a page of the digital memory device; responsive to the page data read instruction receiving function, loading data from the specified page of data into a page buffer in the digital memory device, the page buffer being partitioned into at least a first part and a second part; responsive to the page data read instruction receiving function, performing first ECC processing of the data in the first part of the page buffer to establish first ECC-processed data therein; receiving a buffer read instruction; responsive to the buffer read instruction receiving function, outputting the first ECC-processed data from the first part of the page buffer to a data bus; and performing, in an overlapping relationship with the first ECC-processed data outputting step, second ECC processing of the data in a second part of the page buffer to establish second ECC-processed data therein.

In one variation of the foregoing, the control circuit may further comprises logic and register elements for executing the functions of setting a partition busy bit to "busy" in response either to the page data read instruction or the buffer read instruction; and resetting the partition busy bit to "not busy" upon completion of the second ECC processing performing function.

DETAILED DESCRIPTION OF THE INVENTION

Figure 1:
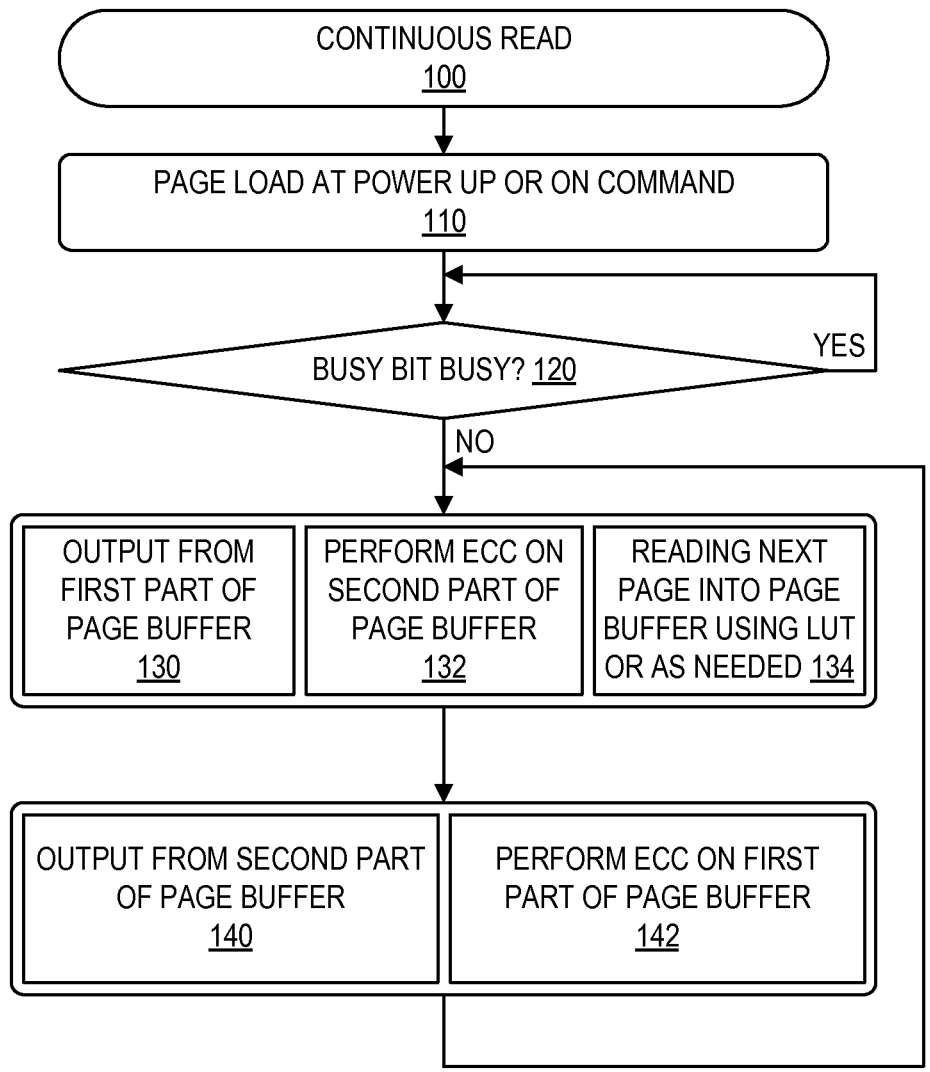
FIG. 1 is a flowchart showing the operations of a serial NAND flash memory for a continuous read.

NAND memory devices may be made compatible with many characteristics of serial NOR memory devices, including: (1) the multi-I/O SPI/QPI interface; (2) small low pin count package types (as small as 8×6 mm at densities of 256 Mb and higher) such as, for example, the 8-contact WSON, 16-pin SOIC, and the 24-ball BGA type packages, with the flexibility of using larger packages such as VBGA-63 typically used with ordinary parallel and ordinary serial NAND flash memory; (3) high clock frequency operation (illustratively 104 MHz) for high transfer rates (illustratively 50 MB/Sec); (4) continuous read across page boundaries without wait intervals, for fast code shadowing applications; (5) logically contiguous addressable good memory through bad block management which is transparent to the external systems and which is without adverse impact on the speed and continuity of the output; and (6) an output starting address of zero or alternatively any other address within the user-addressable space of the memory array via a user-specified or manufacturer-specified value. One such device is type W25N01 GV, which is available from Winbond Electronics Corporation of San Jose, Calif., USA, and is described in Winbond Electronics Corporation, W25N01 GV SpiFlash 3V 1 G-Bit Serial SLC NAND Flash Memory with Dual/Quad SPI & Continuous Read, Preliminary Revision B, Nov. 26, 2013, which hereby is incorporated herein in its entirety by reference thereto. The type W25N01 GV device incorporates a traditional large NAND non-volatile memory space, specifically a 1G-bit memory array organized into 65,536 programmable pages of 2,048-bytes each. The device also incorporates a Serial Peripheral Interface ("SPI") including bit-serial SPI as well as dual serial, quad serial, and quad I/O serial SPI. SPI clock frequencies of up to 104 MHz are supported, allowing equivalent clock rates of 208 MHz (104 MHz×2) for Dual I/O and 416 MHz (104 MHz×4) for Quad I/O when using the Fast Read Dual/Quad I/O instructions. The W25N01 GV device is switchable between a Buffer Read Mode (BUF=1) for accessing data in the page buffer, and a Continuous Read Mode (BUF=0) for efficiently accessing the entire memory array with a single read instruction. The Continuous Read Mode is particularly suitable for code shadowing to RAM, execute-in-place ("XIP"), and rapid retrieval of large voice, video, text and data segments.

Modes for Read Operations

The availability in a NAND memory device of both a Buffer Read Mode and a Continuous Read Mode allows for compatibility with existing systems, including systems originally designed for serial NOR memory, while enabling the device for use for such applications as code shadowing and XIP. While distinct instructions may be used for buffer reads and continuous reads, mode switching is an effective alternative which also allows certain common read instructions to be capable of use in their conventional manner for buffer reads, while also being capable of use for continuous reads. A Buffer Read/Continuous Read Mode Bit BUF may be maintained in a status register. Illustratively, BUF=1 indicates Buffer Read Mode active, while BUF=0 indicates Continuous Page Read ("Continuous Read") Mode active. A read instruction received after the busy period of a Page Data Read instruction is executed in a manner which depends on the value of BUF. If BUF=0, any column address data in the instruction is ignored and the read operation starts from 0x00h column and continues through successive pages until terminated when /CS is asserted high. With Continuous Read Mode, it is possible to read out the entire memory array using a single read instruction. If BUF=1, the read operation begins at the column address [15:0] specified in the instruction and may terminate when the end of the page buffer is read or when /CS is asserted high. Upon termination of the read operation, the DO (IO1) pin may be placed in a high-Z (high impedance) state.

Table 1 shows the sequence for an illustrative Read Data instruction, specifically the 03h instruction, for an ordinary serial NAND flash memory, which implements a buffer read. The same sequence may also be used for a NAND flash memory device operating in a buffer read mode. The sequences for other read instructions such as the Fast Read instruction 0Bh, the Fast Read Dual Output instruction 3Bh, the Fast Read Dual Output With 4-Byte Address instruction 3Ch, the Fast Read Quad Output instruction 6Bh, the Fast Read Quad Output With 4-Byte Address instruction 6Ch, the Fast Read Dual I/O instruction BBh, the Fast Read Dual I/O With 4-Byte Address instruction BCh, the Fast Read Quad I/O instruction EBh, and the Fast Read Quad I/O With 4-Byte Address instruction ECh may be established for the NAND flash memory in a similar manner as for the Read Data instruction 03h. The sequence for the ordinary serial NAND flash memory uses one byte for the instruction opcode, two bytes for the column address C[15:0], and one dummy byte following the column address bytes. Not shown in Table 1 due to space limitations is the full sequence of data streamed in response to the Read Data instruction for the ordinary serial NAND flash memory, which either terminates at the end of the buffer, or wraps around to the start of the buffer until terminated by a /CS transition. If one desires to read additional pages, additional instructions may be issued, but this action comes at the expense of delays due to Ready/Busy checking and the time needed to read a page from the NAND memory array.

Table 1 also shows the sequence for an illustrative Read Data instruction 03h for a NAND flash memory device operating in a continuous read mode. The sequences for other read instructions such as the Fast Read instruction 0Bh, the Fast Read Dual Output instruction 3Bh, the Fast Read Dual Output With 4-Byte Address instruction 3Ch, the Fast Read Quad Output instruction 6Bh, the Fast Read Quad Output With 4-Byte Address instruction 6Ch, the Fast Read Dual I/O instruction BBh, the Fast Read Dual I/O With 4-Byte Address instruction BCh, the Fast Read Quad I/O instruction EBh, and the Fast Read Quad I/O With 4-Byte Address instruction ECh may be established for the NAND flash memory in a similar manner as for the Read Data instruction 03h. Unless identified as a specific instruction by its hex code, the term "Read Data instruction" as used herein may be considered to refer to these and other read instruction variations, in addition to the 03h instruction. The sequence uses one byte for the instruction opcode, and three dummy bytes following the opcode byte. Not shown in Table 1 due to space limitations is the full sequence of data streamed in response to the Read Data instruction in the Continuous Read Mode, which may be terminated when desired by a /CS transition.

mance, unreliability, and bad block limitations that make it difficult to support high speed code shadow and XIP applications with NAND flash memory are described in U.S. Pat. No. 8,667,368 Issued Mar. 4, 2014 to Gupta et al. and entitled "Method and Apparatus for Reading NAND Flash Memory," US Patent Application Publication No. 2013/0346671 published Dec. 26, 2013 in the name of Michael et al. and entitled "On-Chip Bad Block Management for NAND Flash Memory," and US Patent Application Publication No. 2014/0269065 published Sep. 18, 2014 in the name of Jigour et al. and entitled "NAND Flash Memory," all of which hereby are incorporated herein in their entirety by reference thereto.

Continuous Page Read

Figure 2:
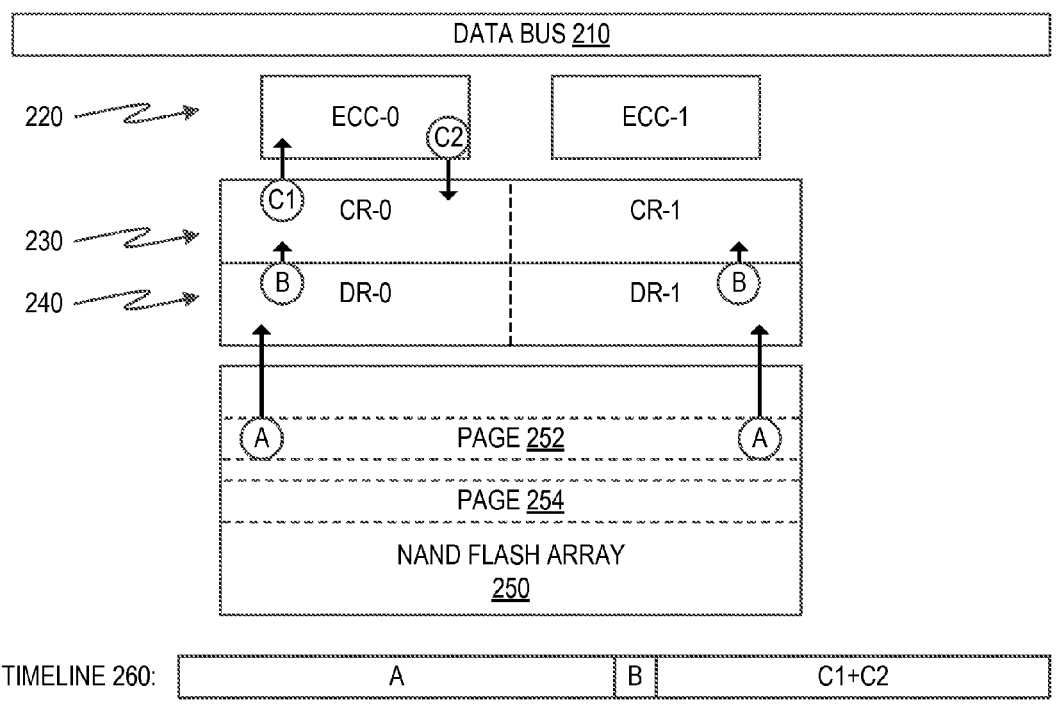
FIG. 2 is a functional block diagram of the functioning of a page buffer having a data register and a cache register during a portion of the continuous read process of FIG. 1.
Figure 3:
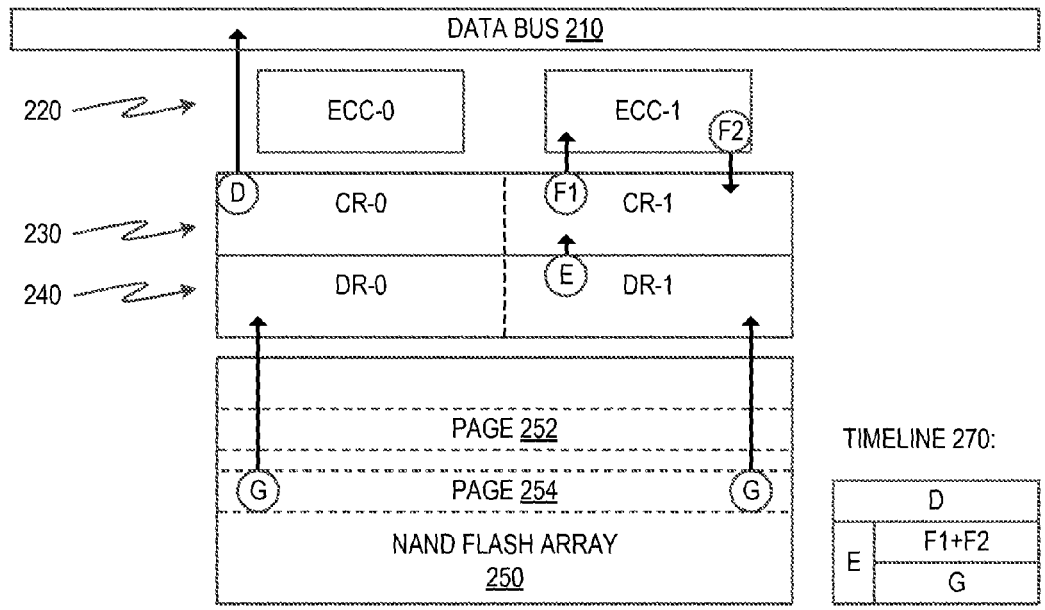
FIG. 3 is a functional block diagram of the functioning of a page buffer having a data register and a cache register during another portion of the continuous read process of FIG. 1.
Figure 4:
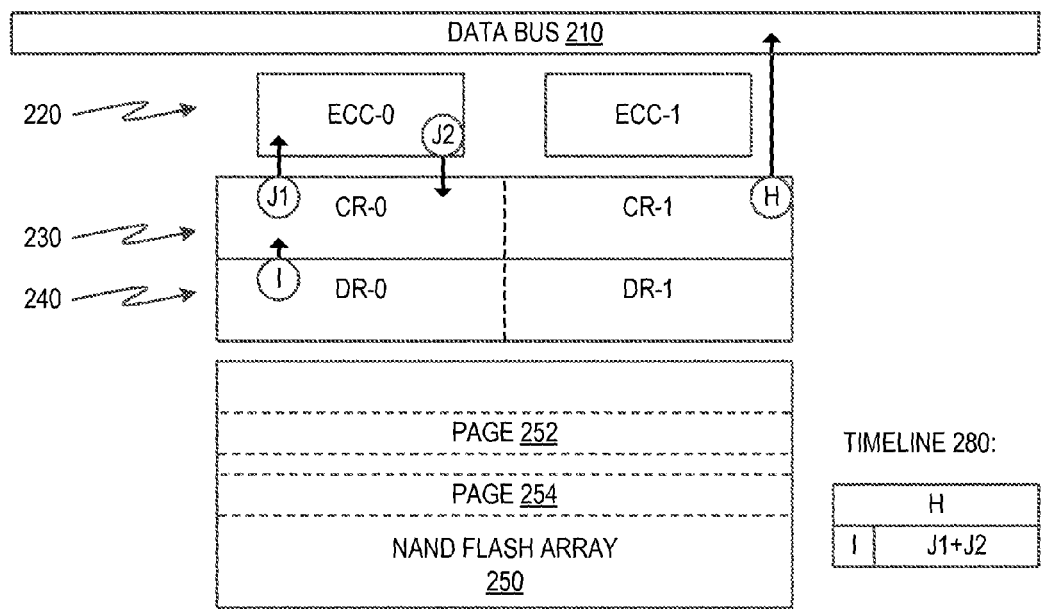
FIG. 4 is a functional block diagram of the functioning of a page buffer having a data register and a cache register during another portion of the continuous read process of FIG. 1.

FIG. 1 is a flowchart showing various operations for carrying out a continuous page read 100 (BUF=0), and FIGS. 2-4 show the various operations as carried out within particular circuits of the NAND memory device. A page is loaded into the page buffer, either at power-up or reset or in response to a Page Data Read instruction or in any other desired manner (block 110). As shown in FIG. 2, two one-page registers cooperate to provide a page buffer, specifically a data register 240 which is partitioned into two parts DR-0 and DR-1, and a cache register 230 which is partitioned into two parts CR-0 and CR-1 which respectively correspond to parts DR-0 and DR-1 of the data register 240. A page 252 is loaded during a first period A into the data register 240, the page is then replicated to the cache register 230 during a second period B (the page may be replicated in its entirety as shown, or only the first part DR-0 of the data register 240 may be replicated to the first part CR-0 of the cache register 230), and ECC processing is performed on the CR-0 part of the cache register 230 over a third period C1+C2, where C1 indicates the time for transfer of data from CR-0 to a first part ECC-0 of ECC circuit 220, and C2 indicates ECC processing time as well as the time for

TABLE 1

| Byte1 Command OpCode | Byte2 | Byte3 | Byte4 | Byte5 | Byte6 | Byte7 | Byte8 |
|---|---|---|---|---|---|---|---|
| ORDINARY SERIAL NAND FLASH DATA READ OPCODE 03h | C15-C8 | C7-C0 | DUMMY | D7-D0 | D7-D0 | D7-D0 | D7-D0 |
| DATA READ OPCODE IN CONT READ MODE 03h | DUMMY | DUMMY | DUMMY | D7-D0 | D7-D0 | D7-D0 | D7-D0 |

Prior to any Read operation, a page data read operation is executed. By default after power up, the data in page 0 will be automatically loaded into the page buffer and the device is ready to accept any read instruction. After power up, a Page Data Read instruction is needed to initiate the data transfer from a specified page in the memory array to the page buffer.

Various techniques may be used to achieve a fast and efficient continuous read operation, such as a data buffer having a partitioned data register and a partitioned cache register, user configurable internal ECC associated with the cache register, and fast bad block management. These and other techniques for overcoming the architectural, perfortransfer of data from ECC-0 to CR-0. These operations are sequential so that the periods are cumulative, as shown in the timeline 260. If desired, ECC processing may be performed on the CR-1 part of the cache register 230 over a fourth period (not shown) which includes the time for transfer of data from CR-1 to a second part ECC-1 of ECC circuit 220, the ECC processing time, and the time for transfer of data from ECC-1 to CR-1.

Returning to FIG. 1, the status of the BUSY bit may be checked (block 120) by using a Read Status Register (0Fh/05h) instruction containing the address of the status register containing the BUSY bit. The status register bits are then shifted out on the DO pin at the falling edge of CLK. The Read Status Register instruction may be used at any time, thereby allowing the BUSY status bit to be checked to determine when the cycle is complete and whether the device can accept another instruction. The Status Register can be read continuously. The instruction may be completed by driving /CS high.

When the BUSY bit has been cleared (block 120—no), a continuous page read may now proceed in response to a Read Data instruction by performing ECC processing of data and output of data from the two parts CR-0 and CR-1 of the cache register 230 in alternation, further coordinated with replication of data from the data register 240 to the cache register 230 and the loading of subsequent pages such as 254 from the NAND flash array 250 into the data register 240. As indicated by blocks 130, 132 and 134, three different operations occur with substantial overlap during the same period of time, namely outputting of data onto the data bus 210 from the first part CR-0 of the cache register 230, performing ECC on the second part CR-1 of the cache register 230, and loading a successive page 254 of the NAND flash array 250 into the data register 240. As shown in FIG. 3, the output of data occurs over a time period D, the ECC processing occurs over a time period F1+F2, and the page load occurs over a time period G, with the time periods D, F1+F2, and G overlapping substantially as shown in timeline 270. A short period E is used to replicate the second part DR-1 of the data register 240 to the second part CR-1 of the cache register 230, and while the period E precedes the periods F1+F2 and G and therefore adds to those time periods, it may overlap the period D.

Next, as indicated by blocks 140 and 142, two different operations occur with substantial overlap during the same period of time, namely outputting of data onto the data bus 210 from the second part CR-1 of the cache register 230, and performing ECC on the first part CR-0 of the cache register 230. As shown in FIG. 4, the output of data occurs over a time period H, and the ECC processing occurs over a time period J1+J2, with the time periods H and J1+J2 overlapping substantially as shown in timeline 280. A short period I is used to replicate the first part DR-0 of the data register 240 to the first part CR-0 of the cache register 230, and while the period I precedes and therefore adds to the period J1+J2, it may overlap the period H.

Fully Compatible Buffer Read

Figure 5:
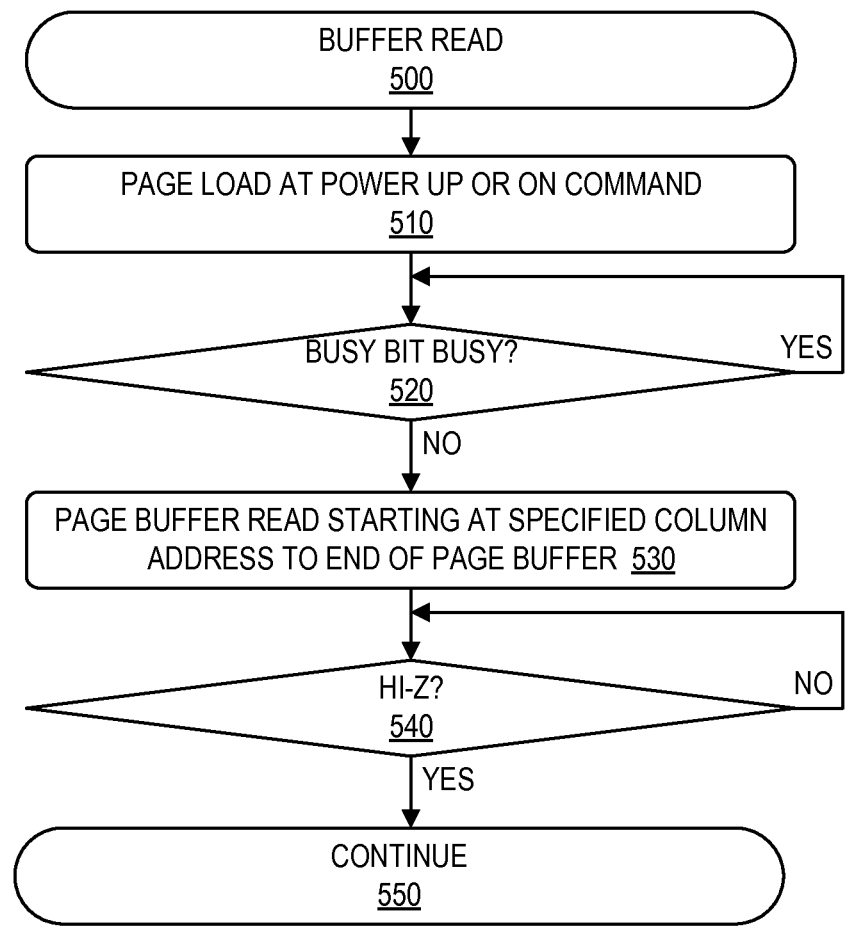
FIG. 5 is a flowchart showing the operations of a serial NAND flash memory for a buffer read.
Figure 6:
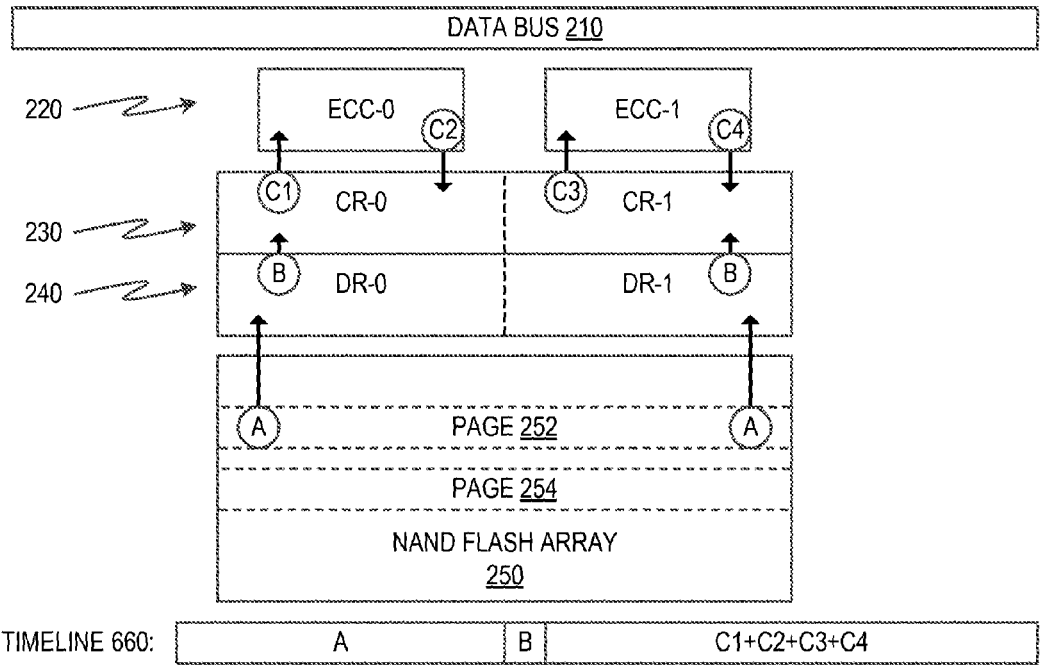
FIG. 6 is a functional block diagram of the functioning of a page buffer having a data register and a cache register during a portion of the buffer read process of FIG. 5.
Figure 7:
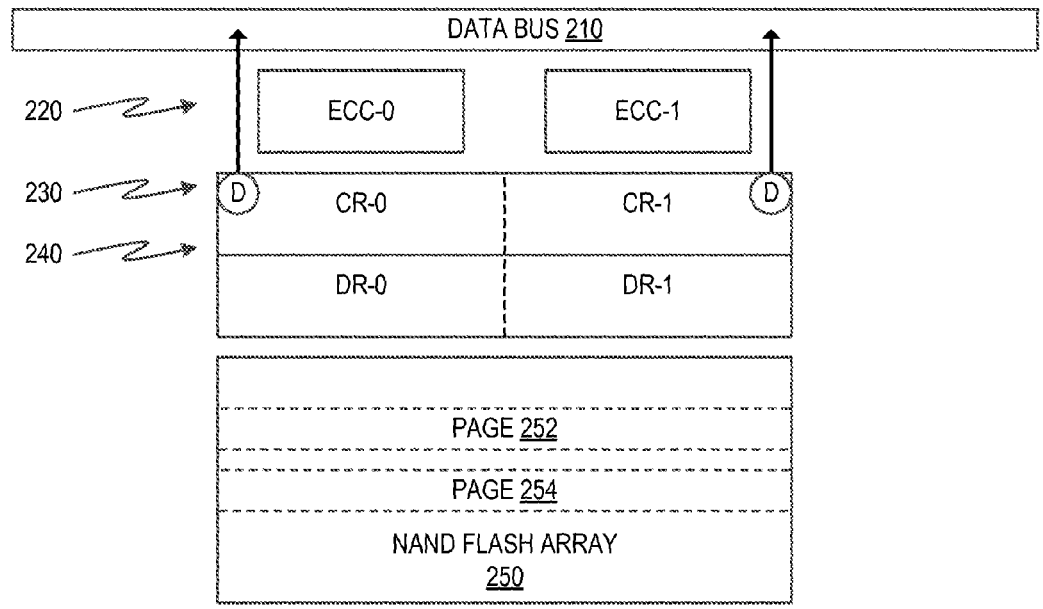
FIG. 7 is a functional block diagram of the functioning of a page buffer having a data register and a cache register during another portion of the buffer read process of FIG. 5.

FIG. 5 is a flowchart showing various operations for carrying out a buffer read 500 (BUF=1), and FIGS. 6-7 show the various operations as carried out within particular circuits of the NAND memory device. A page is loaded into the page buffer, either at power-up or in response to a Page Data Read instruction or in any other desired manner (block 510). As shown in FIG. 6, the data bus 210, ECC circuit 220, cache register 230, data register 240, and NAND flash array 250 are as shown in FIG. 2, but to maintain compatibility with traditional Read Data instructions, the two parts CR-0 and CR-1 of the cache register 230 are not separately utilized and the cache register 230 is treated as a single part register, and the two parts DR-0 and DR-1 of the data register 240 are not separately utilized and the data register 240 is treated as a single part register. A page 252 is loaded during a first period A into the data register 240, the page is then replicated in its entirety to the cache register 230 during a second period B, and ECC processing is performed on the entire cache register 230 over a third period C1+C2+C3+C4, where C1 indicates the time for transfer of data from CR-0 to the first part ECC-0 of ECC circuit 220, C2 indicates ECC processing time as well as the time for transfer of data from ECC-0 to CR-0, C3 indicates the time for transfer of data from CR-1 to the second part ECC-1 of ECC circuit 220, and C4 indicates ECC processing time as well as the time for transfer of data from ECC-1 to CR-1. These operations are sequential so that the periods are cumulative, as shown in the timeline 660.

Returning to FIG. 5, observe that a buffer read may now proceed in response to a Read Data instruction. To maintain compatibility with traditional Read Data instructions, the two parts CR-0 and CR-1 of the cache register 230 are not separately utilized and the cache register 230 is treated as a single part register, and the two parts DR-0 and DR-1 of the data register 240 are not separately utilized and the data register 240 is treated as a single part register. As shown in FIG. 7, the output of data occurs over a time period D.

Enhanced Buffer Read

Unfortunately, the fully compatible buffer read is a very slow operation because of the need to perform a page data read before the buffer read. To fully appreciate this point, consider that the page read shown in FIG. 6 requires about 50 µs (microseconds) to complete based on the following representative time budgets: 20 µs to load the desired page from the NAND flash array 250 to the data register 240 (Period A), and 30 µs to ECC process the entire cache register 230 (Period C1+C2+C3+C4). For the purposes of this explanation, the time to replicate data from the data register 240 to the cache register 230 (Period B) is ignored because it is relatively brief, from 1 µs to 3 µs, and it will be appreciated that the representative time budgets are merely exemplary, since practical time budgets are influenced by many circuit design considerations.

Rather than disregarding the partitioning of the data register 240, the cache register 230, and the ECC circuit 220 for the sake of full compatibility with the traditional buffer read, one may realize a substantial improvement in the page read operation by utilizing the partitioned data register 240, the cache register 230, and the ECC circuit 220 to implement a modified but substantially faster Page Data Read instruction and/or a Buffer Read instruction. As with the term "Read Data" instruction, the term "Buffer Read" instruction may refer not only to a basic instruction, but also to variations thereof for higher frequency reads, multi-bit serial outputs, and/or multi-bit serial inputs.

Figure 8:
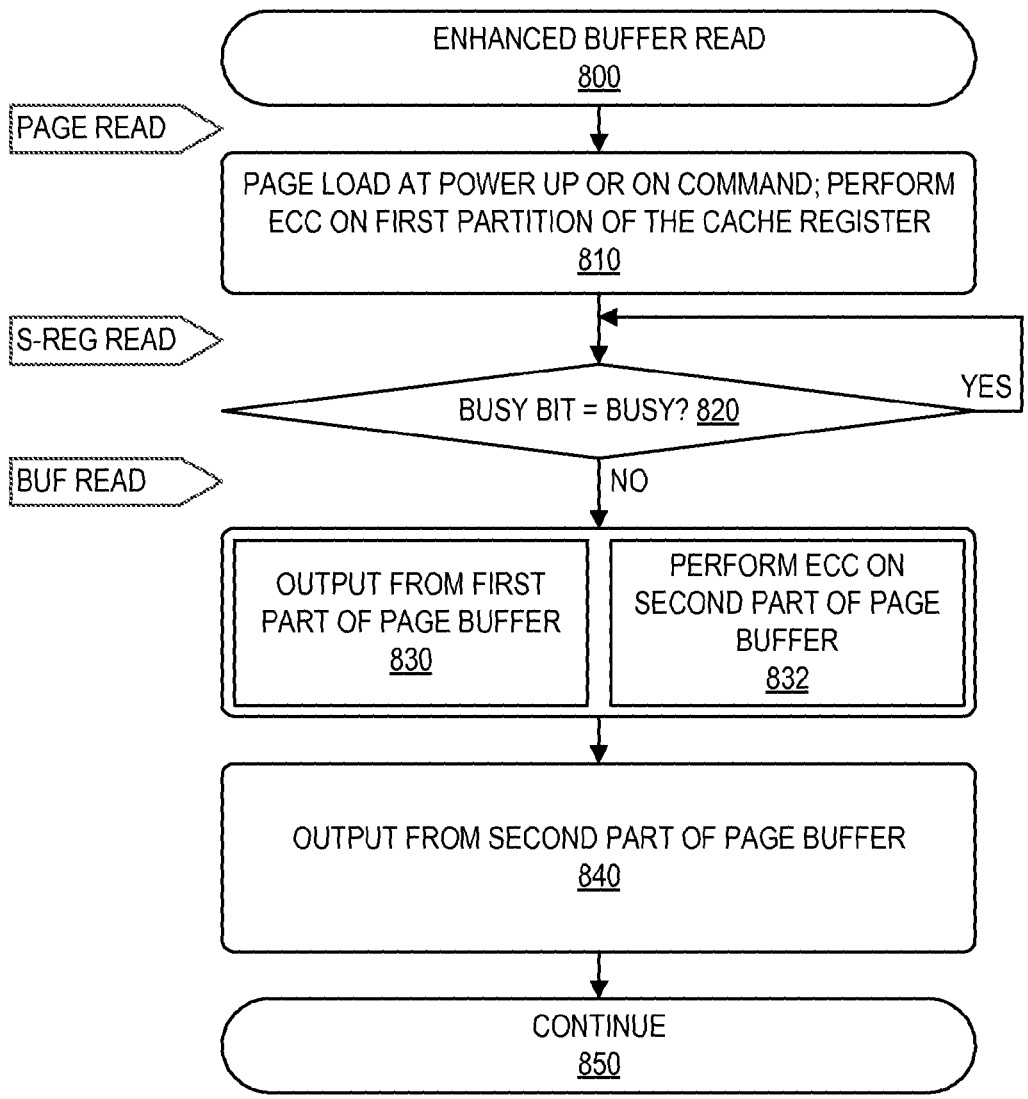
FIG. 8 is a flowchart showing the operations of a serial NAND flash memory for an enhanced buffer read.
Figure 9:
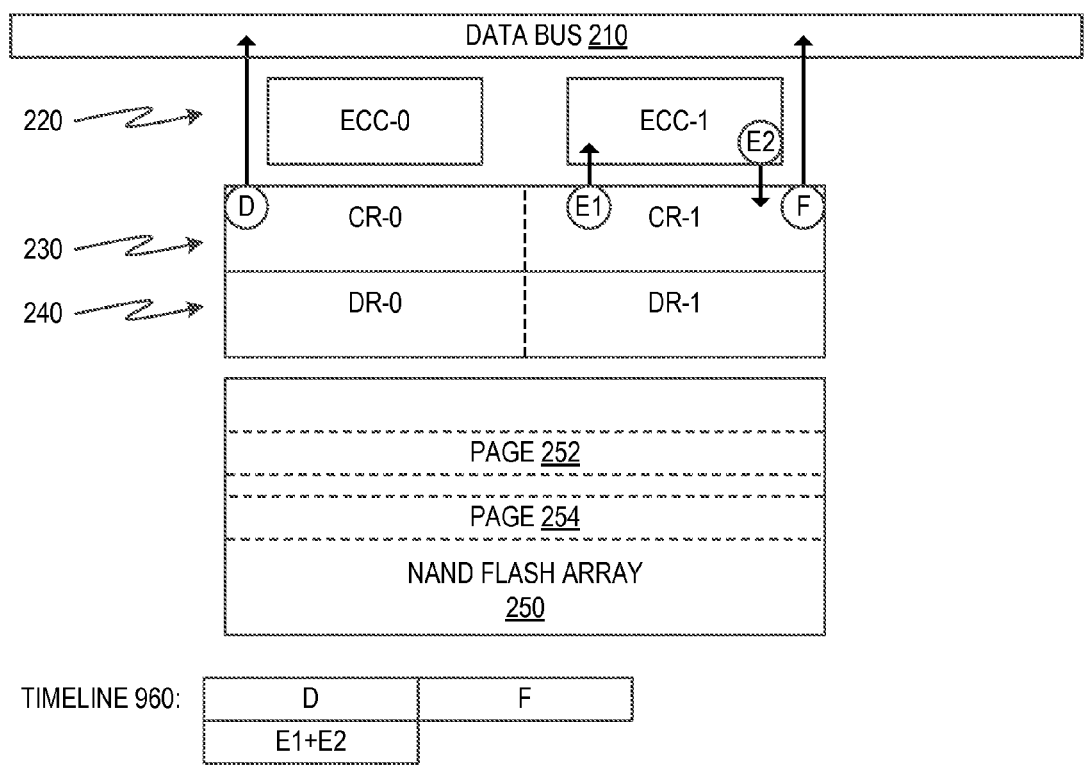
FIG. 9 is a functional block diagram of the functioning of a page buffer having a data register and a cache register during a portion of the buffer read process of FIG. 8.

FIG. 8 is a flowchart showing various operations for carrying out an enhanced buffer read sequence 800 (BUF=1), and FIG. 9 shows some of the various operations as carried out within particular circuits of the NAND memory device. The method of FIG. 8 is particularly useful when the Buffer Read instruction is restricted to beginning the buffer read from column zero, or the user elects to begin the buffer read from column zero. A page is loaded into the page buffer, either at power-up or in response to a Page Data Read instruction or in any other desired manner (block 810). The page load may be carried out in the manner shown in FIG. 2 and related portions of the description, although the BUSY bit monitored in block 820 of the enhanced buffer read sequence 800 is dependent on the busy status of first part CR-0 of the cache register 230, rather than on the entire page as is so for the buffer read sequence 500 (FIG. 5).

The status of the BUSY bit may be checked (block 820) by using a Read Status Register (0Fh/05h) instruction containing the address of the status register containing the BUSY bit. When the BUSY bit indicates not busy (block 820—no), a Buffer Read instruction may be issued which causes two different operations to occur with substantial overlap during the same period of time, namely outputting of data onto the data bus 210 from the first part CR-0 of the cache register 230 (block 830), and performing ECC on the second part CR-1 of the cache register 230 (block 832). As shown in FIG. 9, the output of data occurs over a time period D, and the ECC processing occurs over a time period E1+E2, with the time periods D and E1+E2 overlapping substantially as shown in timeline 960.

Next, as indicated by block 840, the outputting of data to the data bus 210 continues without interruption from the second part CR-1 of the cache register 230. As shown in FIG. 9, the output of data occurs over a time period F. Although period F is additive to period D, the sum D+F is essentially the same duration as the period D shown in FIG. 7 for the buffer read sequence 500 (FIG. 5). When the output is completed, further instructions may be received (block 850).

Figure 10:
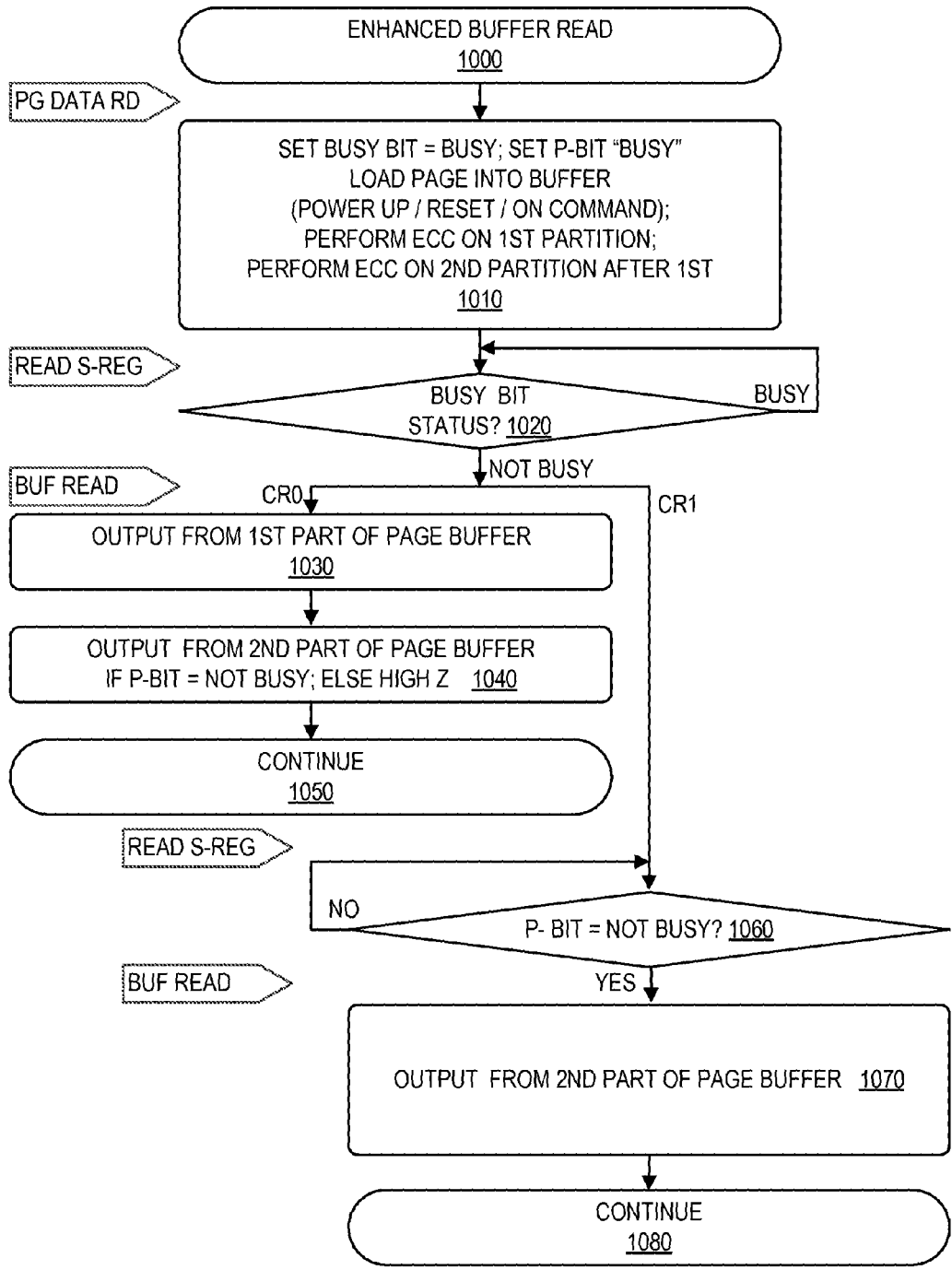
FIG. 10 is a flowchart showing the operations of a serial NAND flash memory for another type of enhanced buffer read.

FIG. 10 is a flowchart showing various operations for carrying out an enhanced buffer read sequence 1000 (BUF=1) on a NAND flash memory device while allowing for the buffer read to begin at any column location. Additional performance improvement may be achieved by using a partition busy bit ("P-bit") to keep track of the ECC status of the data in the second part CR-1 of the cache register 230. A page may be loaded into the page buffer, either at power-up, on reset, or in response to a Page Data Read instruction ("PG DATA RD") or in any other desired manner (block 1010). The page load may be carried out in the manner shown in FIG. 2 and related portions of the description, with two notable differences; namely (a) the Page Data Read instruction affects the status of the "P-bit" by causing the P-bit to be set to indicate a "busy" status for the second part CR-1 of the cache register 230; and (b) the BUSY bit monitored in block 1020 of the enhanced buffer read sequence 1000 is dependent on the busy status of first part CR-0 of the cache register 230, rather than on the entire page as is so for the buffer read sequence 500 (FIG. 5). As shown in the enhanced buffer read 1000, ECC processing of the second part CR-1 of the cache register 230 may be automatically performed after ECC processing of the first part CR-0 of the cache register 230 (block 1010). Alternatively, ECC processing of the second part CR-1 of the cache register 230 (as well as optionally setting of the P-bit) may be performed in response to a buffer read instruction (not shown). Moreover, in some cases it may be desirable to ECC process the second part CR-1 of the cache register 230 with or without the later ECC processing of the first part CR-0 of the cache register 230, which may be accomplished with a specific page data read instruction or by the setting of a particular configuration bit (not shown).

The status of the BUSY bit and the P-bit may be checked by using a Read Status Register (0Fh/05h) instruction ("READ S-REG") with the address of the status register containing the BUSY and P bits. When the BUSY bit indicates Busy (block 1020—busy), the status register is repeatedly checked until the BUSY bit indicates not busy (block 1020—not busy). The next action depends on whether a low or high buffer address is being read. When one desires to start reading from the first part CR-0 of the cache register 230, data is output from the specified address to the end of the first part CR-0 of the cache register 230 (block 1030). If the P-bit indicates "not busy" as may be determined by checking the bit in an internal operation using the control logic of the flash memory device, the ECC processing of the data in the second part CR-1 of the cache register 230 may be assumed to be complete and data may also be output from the beginning to the end of the second part CR-1 (block 1040). If the P-bit indicates "busy," the ECC processing of the data in the second part CR-1 of the cache register 230 may be assumed to be incomplete, and the output may be terminated with the last byte of the first part CR-0, at which time the output goes to high impedance (high Z) (block 1040).

Alternatively, when reading starts from the first part CR-0 of the cache register 230, data may be output from the specified address to the end of the first part CR-0 (not shown), and the output may go high Z without outputting any data from the second part CR-1 of the cache register 230. A separate buffer read may then be used to access data in the second part CR-1.

When one wishes to begin reading from the second part CR-1 of the cache register 230, the P-bit is checked (block 1060—no) until it indicates "not busy" (block 1060—yes), at which time data is output from the specified address to the end of the second part CR-1 (block 1070).

The performance improvement realized by using the enhanced page read and buffer read techniques shown in FIGS. 8 and 10 is substantial, relative to a buffer read that does not use the partitioning techniques described herein. The page read shown in FIG. 6, which does not take advantage of page buffer partitioning, requires about 50 μs to complete, assuming 20 μs to load the desired page from the NAND flash array 250 to the data register 240 (Period A), and 30 μs to ECC process the entire cache register 230 (Period C1+C2+C3+C4). The time required to complete the subsequent buffer read depends on the frequency of operation and the serial output configuration—single, dual or quad. Illustratively, for a serial NAND flash memory clocked at 104 MHz, each clock has about a 9.6 ηs (nanoseconds) period, so that a 2,048 byte page (ignoring for clarity any supplemental bytes for the page) which is output using SPI quad requires about 40 μs. The full buffer read sequence 500 shown in FIG. 5, therefore, requires a minimum of about 90 μs to complete.

In contrast, the enhanced buffer read sequence 800 shown in FIG. 8 (output begins at column 0), which takes advantage of page buffer partitioning, requires 20 μs to load the desired page of data from the NAND flash array 250 to the data register 240 (Period A), 15 μs to ECC process the first part CR-0 of the cache register 230 (Period C1+C2), 20 μs to output the first part CR-0 of the 2,048 byte cache register 230, and 20 μs to output the second part CR-1 of the 2,048 byte cache register 230. The total time is therefore about 75 μs, which is about a 17 percent improvement over the buffer read sequence 500 (FIG. 5).

The improvement using the enhanced buffer read sequence 1000 shown in FIG. 10 (output begins at any column address in cache register 230) varies based on the column address specified and whether both parts or only one part of the cache register 230 is being read. The following analysis assumes that one wishes to read from a specified column address to the end of the cache register 230, although even further improvement may be realized in some cases if one wishes to read from only one part of the cache register 230. Also the output time is ignored since it varies depending on the specified column address and is in any case similar for the various techniques compared. Comparisons therefore are made to the page read for the buffer read sequence 500 (FIG. 5), which requires 50 μs (20 μs for the page load, plus 15 μs for ECC processing of CR-0, plus 15 μs for ECC processing of CR-1). When a column address is specified near the beginning of the first part CR-0 of the cache register 230, the time budget is about 35 μs calculated as follows: 20 μs for the page load, plus 15 μs for ECC processing of CR-0. ECC processing of CR-1 is hidden within the time for outputting CR-0. When a column address is specified near the end of the first part CR-0 of the cache register 230, the time budget is about 50 µs calculated as follows: 20 µs for the page load, plus 15 µs for ECC processing of CR-0, plus 15 µs for ECC processing of CR-1. The variable amount of this time hidden by the time for outputting CR-0 is ignored in this analysis). When a column address is specified in second part CR-1 of the cache register 230, the time budget is about 50 µs calculated as follows: 20 µs for the page load, plus 15 µs for ECC processing of CR-0, plus 15 µs for ECC processing of CR-1. This time budget may be reduced to about 35 µs if a specific page data load instruction or configuration bit is used to ECC process the second part CR-1 of the cache register 230 with or without the later ECC processing of the first part CR-0 of the cache register 230.

Serial NAND Flash Memory Architecture

Figure 11:
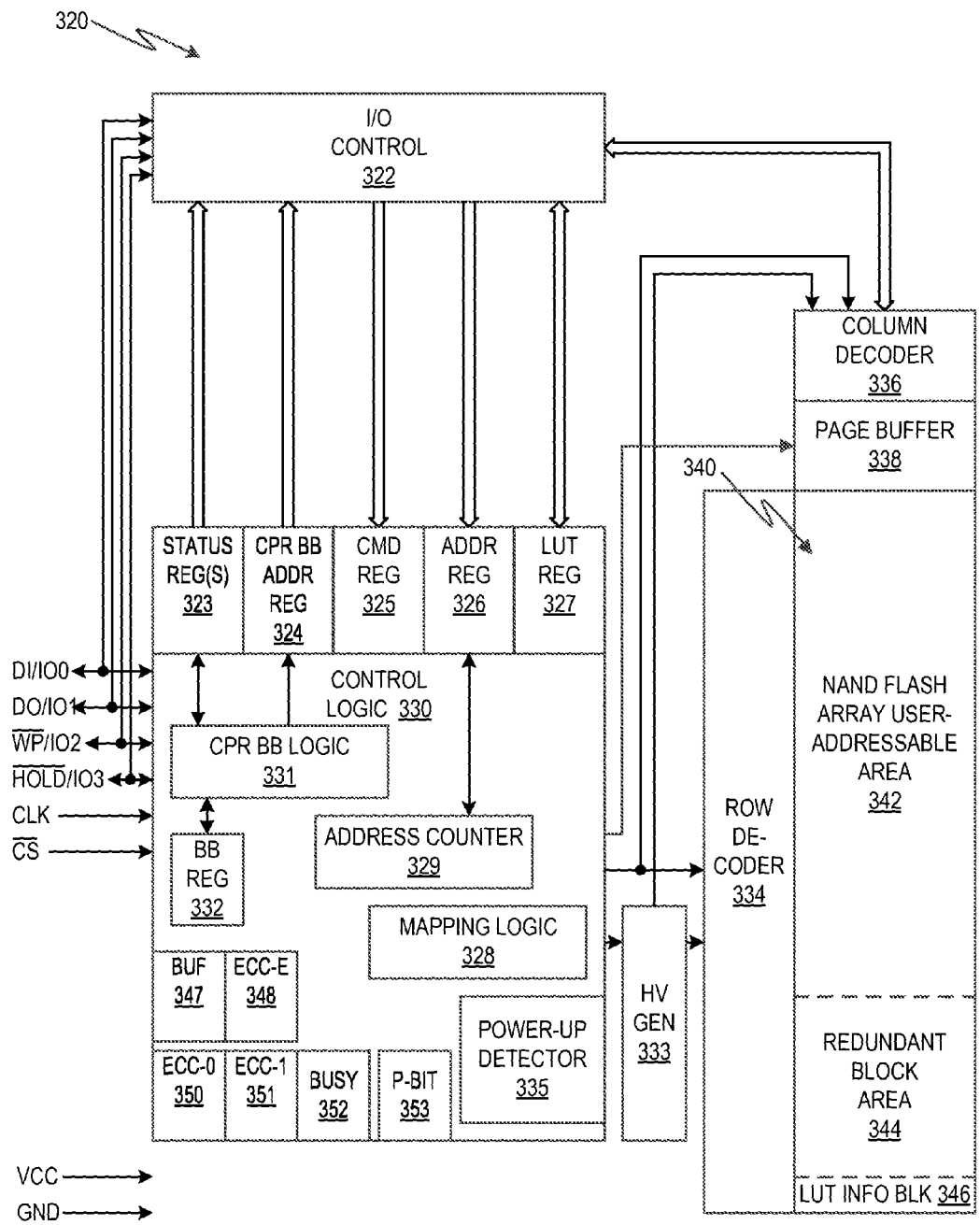
FIG. 11 is a schematic functional block diagram of a serial NAND flash memory.

FIG. 11 is a schematic functional block diagram of an illustrative serial NAND flash memory 320 which is capable of providing a continuous read across page boundaries and from logically contiguous memory locations without wait intervals, and which is also capable of providing an enhanced buffer read as shown in FIGS. 8 and 10. The serial NAND flash memory 320 includes a NAND flash array 340 and associated page buffer 338. The NAND flash array 340 includes word (row) lines and bit (column) lines, and is organized into a user-addressable area 342, a redundant block area 344, and a LUT information block 346. Any desired flash memory cell technology may be used for the flash memory cells of the NAND flash array 340. The serial NAND flash memory 320 may include various other circuits to support memory programming, erase and read, such as row decoder 334, column decoder 336, I/O control 322, status register(s) 323, continuous page read ("CPR") address register(s) 324, command register 325, address register 326, a LUT register 327, control logic 330, CPR bad block logic 331, a CPR bad block register 332, and high voltage generators 333. The row decoder 334 selects rows of the user-addressable area 342 under user control as well as, in some implementations, under internal control; and selects rows of the redundant block area 344 and LUT information block 346 under internal control. Power is supplied (not shown) throughout the circuits of the serial NAND flash memory 320 by power lines VCC and GND. While the NAND flash memory 320 may be packaged in any desired manner and may have any type of interface, including ordinary NAND flash memory interfaces, the control logic 330 of FIG. 11 illustratively implements the SPI/QPI protocol, including the multi-IO SPI interface. Additional detail on the SPI/QPI interface and on the various circuits of the memory may be found in U.S. Pat. No. 7,558,900 issued Jul. 7, 2009 to Jigour et al., and in the aforementioned data sheet by Winbond Electronics Corporation, W25N01 GV Spi-Flash 3V 1G-Bit Serial SLC NAND Flash Memory with Dual/Quad SPI & Continuous Read, Preliminary Revision B, Nov. 26, 2013, which hereby are incorporated herein in their entirety by reference thereto.

If mode switching is desired, a buffer mode flag BUF 347 may be provided. The buffer mode flag 347 may be provided as a bit of the status register(s) 323 if desired. A power-up detector 335 is provided in the control logic 330 to initiate the setting of a particular mode and the loading of a default page upon power-up.

BUSY 352 is a read only bit in the status register that is set to a 1 state when the device is powering up or executing various instructions, including the Page Data Read instruction and the Continuous Read instruction. BUSY 352 may also be used for the Buffer Read instruction when beginning with a column address in the first part CR-0 of the cache register 230, since the data output could end and the output pins returned to a high impedance state before ECC processing of data in the second part CR-1 of the cache register 230 has completed. During this time the device ignores further instructions except for specific instructions such as the Read Status Register and Read JEDEC ID instructions. When the executing instruction completes, the BUSY bit 352 is cleared to a 0 state, indicating the device is ready for further instructions. The BUSY 352 bit may be provided as part of the status register(s) 323 if desired.

The page buffer 338 illustratively includes a one-page data register (not shown), a one-page cache register (not shown), and one page of gates (not shown) for replicating data from the data register to the cache register. Any suitable latch or memory technology may be used for the data register and the cache register, and any suitable gating technology may be used for replicating data from the data register to the cache register. The data register and the cache register may be organized in any desired number of respective portions by, for example, the manner in which the gates are wired and operated to control the replication of data. Illustratively, the data register and the cache register may be organized in two respective portions each, and operated in alternation by using respective groups of gates controlled by respective control lines. The data register and the cache register of the page buffer 338 may be operated in a conventional manner by applying the same control signal to respective gate control lines, or may be operated in alternation by applying suitable timed control signals to the gate control lines. Illustratively in a two portion implementation in which a page is 2K Bytes, a half-page (1K) of gates may be controlled by one control line and the other half-page (1K) of gates may be controlled by another control line, thereby organizing the data register and the cache register in two half-page (1K) portions. Because of the operation of two portions in alternation, a two-portion implementation of the page buffer 338 may be referred to as a "ping pong" buffer. An ECC circuit (not show) may be provided to perform ECC computations on the contents of the cache register depending on the status of an ECC-E flag 348. ECC status bits ECC-0 350 and ECC-1 351 are provided to indicate the error condition of the data in the associated page, and may be checked after the completion of a Read operation to verify the data integrity. The ECC-E 348, ECC-0 350 and ECC-1 351 bits may be provided as part of the status register(s) 323 if desired.

A partition busy bit P-bit 353 is included to facilitate buffer reads from the second part CR-1 of the cache register 230. The P-bit 353 may be an internal bit or may be part of the status register(s) 323 if desired.

A different size of page buffer may be used and/or a division of the page buffer into more than two portions or into unequal portions may be done if desired. Two sets of control signals may be needed for two portions of the page buffer, unlike one set of control signals needed for an undivided page buffer. Furthermore, differences between the logical and physical NAND flash array does not affect teachings herein. For example, the physical array may have two pages (even 2 KB page and odd 2 KB page) on one word line, so that a word line may be 4 KB of NAND bit cells. For clarity, the description and drawings herein are based upon the logical NAND flash array. The error correction circuit 220 logically may be thought of as having a section ECC-0 which provides error correction of the contents of the cache register portion CR-0, and a section ECC-1 which provides error correction of the contents of the cache register portion CR-1. Various ECC algorithms are suitable for use, including, for example, Hamming ECC algorithm, BCH ECC algorithm, Reed-Solomon ECC algorithm, and others. While two logical ECC sections ECC-0 and ECC-1 are shown as respectively interfacing with CR-0 and CR-1 for clarity of explanation, either two physical ECC blocks or a single physical ECC block may be used to interface with both CR-0 and CR-1. Additional detail on the page buffer 338, the ECC circuit, and their operations may be found in the aforementioned U.S. Pat. No. 8,667,368 Issued Mar. 4, 2014 to Gupta et al. and entitled "Method and Apparatus for Reading NAND Flash Memory," which hereby is incorporated herein in its entirety by reference thereto. Continuous page read as described herein is referred to as "modified continuous page read" in the aforementioned patent application. This manner of organizing the data register and cache register into portions and performing ECC on the portions is illustrative, and other techniques may be used if desired.

While the NAND flash memory 320 is organized and operated to perform a variety of read operations including continuous page read operations and on-chip ECC in a single-plane NAND Architecture, this architecture is illustrative and variations thereof are contemplated. It will be appreciated that the example of a 2 KB Page size and a specific block size are illustrative and may be different if desired. Moreover, the specific size reference is not to be taken literally, since the actual page size may vary depending on design factors; for example, the term may include a 2,048 Byte main area plus an additional 64 Byte spare area, where the spare area is used for storing ECC and other information such as meta data. In the same way, the term 1 KB may refer to a 1,024 Byte main area and a 32 Byte spare area. While the description herein is based upon a single-plane architecture for clarity, the teachings set forth herein are equally applicable to multi-plane architectures. When multiple physical planes are used, they may share one or more word-lines so that the memory system may service multiple I/O requests simultaneously. Each plane provides a page of data and includes a corresponding data register of one page size and a corresponding cache register of one page size. The techniques described herein may be applied to each plane separately such that each data register and cache register is organized in multiple portions, or may be applied to multiple planes such that each data register and cache register is itself one portion of a multiple page data register and cache register.

FIG. 11 also shows control signals /CS, CLK, DI, DO, /WP and /HOLD which are for the SPI interface. The standard SPI flash interface provides /CS (chip select—complement), CLK (clock), DI (serial data-in), and DO (serial data-out) signals, along with optional signals /WP (write protect—complement) and /HOLD (hold—complement). While the 1-bit serial data bus (data-in through DI and data-out through DO) in the standard SPI interface provides a simple interface and compatibility with many controllers which boot up in single SPI mode, it is limited in achieving higher read thru-put. A multi-bit SPI interface therefore evolved to additionally support dual (2-bit interface) and/or quad (4-bit interface) for increased read thru-put. FIG. 11 also shows additional data bus signals for Dual SPI and Quad SPI operation, i.e. I/O(0), I/O(1), I/O(2), and I/O(3), by selectively redefining the function of four pins. In one illustrative version of the Quad SPI read operation (other versions may be envisioned), the appropriate read instruction may be given with 1-bit standard SPI interface through I/O(0), but subsequent interface for address and data-out may be Quad based (i.e. 4-bit data bus). The Quad SPI read operation can output 4-bits of data in a clock cycle as compared to output 1-bit of data in standard SPI read operation, and therefore the Quad SPI read operation can provide four times higher read thru-put. While Quad SPI read operation is used herein for explanation, the teachings herein are equally applicable to the other modes of operation, including but not limited to single SPI, dual SPI, Quad Peripheral Interface ("QPI") and Double Transfer Rate ("DTR") read modes. In the QPI protocol, the complete interface (opcode, address, and data-out) is done on 4-bit basis. In the DTR protocol, the output data is provided on both low-going and high-going CLK edge, rather than providing output data only on low-going CLK edge as in Single Transfer Rate ("STR") read mode operation.

The description of the invention including its applications and advantages as set forth herein is illustrative and is not intended to limit the scope of the invention, which is set forth in the claims. Variations and modifications of the embodiments disclosed herein are possible, and practical alternatives to and equivalents of the various elements of the embodiments would be understood to those of ordinary skill in the art upon study of this patent document. For example, although many of the implementations described herein are for serial NAND memory, certain techniques described herein such as the power-up sequence, mode selection, and continuous data output across page boundaries and from logically contiguous memory locations without wait intervals, may be used for parallel NAND memory. Moreover, specific values given herein are illustrative and may be varied as desired, and terms such as "first" and "second" are distinguishing terms and are not to be construed to imply an order or a specific part of the whole. Terms such as "reset" and "set" are relative terms, and while "reset" may be understood to signify a logical zero while "set" may be understood to signify a logical one, the opposite logical states may be signified instead. These and other variations and modifications of the embodiments disclosed herein, including of the alternatives and equivalents of the various elements of the embodiments, may be made without departing from the scope and spirit of the invention, including the invention as set forth in the following claims.

The invention claimed is:

1. A method of operating a digital memory device to read data from a page of data stored therein to a data bus, comprising:
receiving a page data read instruction specifying a page of the digital memory device;
responsive to the page data read instruction receiving step, setting a first status bit and a second status bit to "busy;" responsive to the page data read instruction receiving step, loading data from the specified page of data into a page buffer in the digital memory device, the page buffer being partitioned into at least a first part and a second part;
responsive to the page data read instruction receiving step, performing first ECC processing of the data in the first part of the page buffer to establish first ECC-processed data therein;
resetting the first status bit to "not busy" upon completion of the first ECC processing performing step;
responsive to the page data read instruction receiving step, performing second ECC processing of the data in a second part of the page buffer to establish second ECC-processed data therein; and
resetting the second status bit to "not busy" upon completion of the second ECC processing performing step.

2. The method of claim 1, further comprising:
receiving a buffer read instruction; and
responsive to the buffer read instruction receiving step, outputting the first ECC-processed data from the first part of the page buffer to the data bus, in an overlapping relationship with the second ECC processing performing step.

3. The method of claim 2, further comprising:
responsive to the buffer read instruction receiving step, determining in an internal operation of the digital memory device that the second status bit indicates "not busy;" and
responsive to the buffer read instruction receiving step and the determining step, outputting the second ECC-processed data from the second part of the page buffer to the data bus contiguously with the first ECC-processed data outputting step.

4. The method of claim 2, further comprising:
responsive to the buffer read instruction receiving step, determining in an internal operation of the digital memory device that the second status bit indicates "busy;" and
responsive to the buffer read instruction receiving step and the determining step, terminating output from the page buffer upon completion of the first ECC-processed data outputting step.

5. The method of claim 1, further comprising:
receiving a read status register instruction;
responsive to the read status register instruction receiving step, determining that the second status bit indicates "not busy;" and
responsive to the buffer read instruction receiving step and the determining step, outputting the second ECC-processed data from the second part of the page buffer to the data bus.

6. The method of claim 1, wherein:
the page buffer comprises a cache register and a data register, the first part of the page buffer comprising a first part of the cache register and a first part of the data register, and the second part of the page buffer comprising a second part of the cache register and a second part of the data register;
the data loading step comprises loading data from the specified page of data into the data register, and replicating the data into the cache register;
the first ECC processing performing step comprises performing the first ECC processing of the data in the first part of the cache register to establish the first ECC-processed data therein; and
the second ECC processing performing step comprises performing the second ECC processing of the data in the second part of the cache register to establish the second ECC-processed data therein.

7. A method of operating a digital memory device to read data from a page of data stored therein, comprising:
receiving a page data read instruction specifying a page of the digital memory device;
responsive to the page data read instruction receiving step, loading data from the specified page of data into a page buffer in the digital memory device, the page buffer being partitioned into at least a first part and a second part;
responsive to the page data read instruction receiving step, performing first ECC processing of the data in the first part of the page buffer to establish first ECC-processed data therein;
receiving a buffer read instruction;
responsive to the buffer read instruction receiving step, outputting the first ECC-processed data from the first part of the page buffer to a data bus; and
performing, in an overlapping relationship with the first ECC-processed data outputting step, second ECC processing of the data in a second part of the page buffer to establish second ECC-processed data therein.

8. The method of claim 7 further comprising:
responsive to the page data read instruction receiving step, setting a partition busy bit to "busy;" and
resetting the partition busy bit to "not busy" upon completion of the second ECC processing performing step.

9. The method of claim 8 further comprising:
detecting the "not busy" status of the partition busy bit from the resetting step; and
responsive to the detecting step, outputting the second ECC-processed data in the second part of the page buffer to the data bus resetting step.

10. The method of claim 8 further comprising:
detecting the "not busy" status of the partition busy bit from the resetting step;
receiving a further buffer read instruction; and
responsive to the further buffer read instruction receiving step and to the detecting step, outputting the second ECC-processed data in the second part of the page buffer.

11. The method of claim 7 wherein the second ECC processing performing step is responsive to the page data read instruction receiving step.

12. The method of claim 7 wherein the second ECC processing performing step is responsive to the buffer read instruction receiving step.

13. The method of claim 7:
wherein the page buffer comprises a data register partitioned into a plurality of parts, and a cache register partitioned into a plurality of parts corresponding to the parts of the data register; and
wherein the loading step comprises loading data from the specified page of data into the data register;
further comprising replicating the data in the data register to the cache register;
wherein the first ECC processing performing step comprises performing ECC processing of the data in the first part of the cache register to establish the first ECC-processed data therein;
wherein the first ECC-processed data outputting step comprises outputting the first ECC-processed data from the first part of the cache register to the data bus;
wherein the second ECC processing performing step comprises performing ECC processing of the data in the second part of the cache register to establish the second ECC-processed data therein; and
wherein the second ECC-processed data outputting step comprises outputting the second ECC-processed data from the second part of the cache register to the data bus.

14. The method of claim 7 further comprising:
responsive to the page data read instruction receiving step, setting a status bit to "busy;" and
resetting the status bit to "not busy" upon completion of the first ECC processing performing step.

15. A digital memory device comprising:
a NAND flash memory array;
a row decoder coupled to the NAND flash memory array;
a data register coupled to the NAND flash memory array;
a cache register coupled to the data register;
an ECC circuit coupled to the cache register;

a column decoder coupled to the cache register; and
a control circuit coupled to the row decoder, the column decoder, the data register, the cache register, and the ECC circuit, wherein the control circuit comprises logic and register elements for executing the functions of:
  receiving a page data read instruction specifying a page of the digital memory device;
  responsive to the page data read instruction receiving function, loading data from the specified page of data into a page buffer in the digital memory device, the page buffer being partitioned into at least a first part and a second part;
  responsive to the page data read instruction receiving function, performing first ECC processing of the data in the first part of the page buffer to establish first ECC-processed data therein;
  receiving a buffer read instruction;
  responsive to the buffer read instruction receiving function, outputting the first ECC-processed data from the first part of the page buffer to a data bus; and
  performing, in an overlapping relationship with the first ECC-processed data outputting step, second ECC processing of the data in a second part of the page buffer to establish second ECC-processed data therein.

16. The digital memory device of claim 15 further comprising a partition busy bit, wherein the control circuit further comprises logic and register elements for executing the functions of:
  responsive to the page data read instruction receiving function, setting a partition busy bit to "busy;" and
  resetting the partition busy bit to "not busy" upon completion of the second ECC processing performing function.

17. The digital memory device of claim 15 further comprising a partition busy bit, wherein the control circuit further comprises logic and register elements for executing the functions of:
  responsive to the buffer read instruction receiving function, setting a partition busy bit to "busy;" and
  resetting the partition busy bit to "not busy" upon completion of the second ECC processing performing function.

18. The digital memory device of claim 15, wherein second ECC processing performing function is responsive to the page data read instruction receiving function.

19. The digital memory device of claim 15, wherein second ECC processing performing function is responsive to the buffer read instruction receiving function.

20. The digital memory device of claim 15 further comprising a status bit, wherein the control circuit further comprises logic and register elements for executing the functions of:
  responsive to the page data read instruction receiving step, setting the status bit to "busy;" and
  resetting the status bit to "not busy" upon completion of the first ECC processing performing step.

* * * * *